(12) United States Patent
Van Leeuwen et al.

(10) Patent No.: US 10,267,875 B2
(45) Date of Patent: Apr. 23, 2019

(54) MRI INVOLVING A DISTRIBUTED SENSOR TO MONITOR THE TEMPERATURE AND/OR STRAIN OF COIL CABLES AND TRAPS

(71) Applicant: KONINKLIJKE PHILIPS N.V., Eindhoven (NL)

(72) Inventors: Laurens Cornelis Van Leeuwen, Eindhoven (NL); Johan Mathieu Alfons Helsen, Eindhoven (NL); Paulus Cornelius Hendrikus Adrianus Haans, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 328 days.

(21) Appl. No.: 14/442,145

(22) PCT Filed: Oct. 31, 2013

(86) PCT No.: PCT/IB2013/059822
§ 371 (c)(1),
(2) Date: May 12, 2015

(87) PCT Pub. No.: WO2014/076603
PCT Pub. Date: May 22, 2014

(65) Prior Publication Data
US 2016/0291103 A1   Oct. 6, 2016

Related U.S. Application Data

(60) Provisional application No. 61/726,735, filed on Nov. 15, 2012.

(51) Int. Cl.
*G01R 33/38*   (2006.01)
*G01R 33/36*   (2006.01)
(Continued)

(52) U.S. Cl.
CPC .......... *G01R 33/3804* (2013.01); *G01K 11/32* (2013.01); *G01K 13/00* (2013.01); *G01R 33/288* (2013.01); *G01R 33/3685* (2013.01)

(58) Field of Classification Search
CPC . G01R 33/4828; G01R 33/3804; G01K 13/00
See application file for complete search history.

(56) References Cited

U.S. PATENT DOCUMENTS

| 4,827,487 | A | | 5/1989 | Twerdochlib |
| 5,730,134 | A | * | 3/1998 | Dumoulin .............. A61B 5/01 600/412 |

(Continued)

FOREIGN PATENT DOCUMENTS

| JP | 7140195 A | 6/1995 |
| JP | 2004358264 A | 12/2004 |

(Continued)

OTHER PUBLICATIONS

Kurpad,K.N. et al "Suppression of RF Heating due to Intravascular Devices using Non-Resonant In-line Coaxial Choke Baluns", Processing of the International Society for Magnetic Resonance in Medicine, vol. 19, 2011, pp. 1750.

*Primary Examiner* — Giovanni Astacio-Oquendo
*Assistant Examiner* — Alvaro Fortich (57) ABSTRACT

A magnetic resonance (MR) system 10 includes at least one cable (30, 32, 34) that has at least one optic fiber component (31C, 31E, 33B, 35B) and an optical monitoring unit (37) in communication with the at least one optic fiber component (31C, 31E, 33B, 35B). The optical monitoring unit (37) is configured to determine temperatures at each of a plurality of positions along the at least one optic fiber component (31C, 31E, 33B, 35B). The optical monitoring unit (37) is further configured to halt an operation of the MR system (10) in response to at least one determined temperature. In accordance with the invention, the temperature of one or (Continued)

more cable traps forming part of the cable can be monitored and a faulty cable trap can be detected.

19 Claims, 7 Drawing Sheets

(51) Int. Cl.
  *G01K 11/32* (2006.01)
  *G01K 13/00* (2006.01)
  *G01R 33/28* (2006.01)

(56) References Cited

U.S. PATENT DOCUMENTS

| | | | |
|---|---|---|---|
| 5,882,305 A | 3/1999 | Dumoulin | |
| 5,978,115 A * | 11/1999 | Condict | H04B 10/07 398/14 |
| 6,278,810 B1 | 8/2001 | Sirkis | |
| 6,347,237 B1 * | 2/2002 | Eden | H01P 7/082 333/185 |
| 6,362,620 B1 * | 3/2002 | Debbins | G01R 33/54 324/309 |
| 6,366,722 B1 | 4/2002 | Murphy | |
| 6,758,271 B1 * | 7/2004 | Smith | E21B 43/26 166/250.1 |
| 7,077,566 B2 | 7/2006 | Rajendran | |
| 7,330,245 B2 | 2/2008 | Froggatt | |
| 7,440,087 B2 | 10/2008 | Froggatt | |
| 7,538,883 B2 | 5/2009 | Froggatt | |
| 7,772,541 B2 | 8/2010 | Froggatt | |
| 8,004,686 B2 | 8/2011 | Froggatt | |
| 8,547,102 B2 | 10/2013 | Nozaki | |
| 9,116,055 B2 * | 8/2015 | Johnston | G01K 11/3206 |
| 2001/0037062 A1 * | 11/2001 | Ehnholm | G01R 33/62 600/414 |
| 2002/0087066 A1 | 7/2002 | Hellinger | |
| 2003/0139665 A1 * | 7/2003 | Takayama | G16H 40/40 600/407 |
| 2004/0036558 A1 * | 2/2004 | Allison | H01P 1/203 333/205 |
| 2004/0129418 A1 * | 7/2004 | Jee | C12N 13/00 166/250.01 |
| 2005/0206380 A1 * | 9/2005 | Seeber | G01R 33/4804 324/315 |
| 2007/0219766 A1 * | 9/2007 | Duggleby | G06F 9/3879 703/9 |
| 2008/0122441 A1 * | 5/2008 | Hayakawa | G01R 33/28 324/318 |
| 2008/0231269 A1 * | 9/2008 | Ookawa | G01R 33/3415 324/307 |
| 2008/0278175 A1 * | 11/2008 | Wexler | G01K 1/14 324/546 |
| 2008/0309430 A1 * | 12/2008 | Tsuzuki | H03H 7/0153 333/174 |
| 2010/0108311 A1 * | 5/2010 | Daussin | E21B 43/025 166/250.01 |
| 2010/0308840 A1 * | 12/2010 | Nerreter | G01R 33/288 324/543 |
| 2011/0037471 A1 | 2/2011 | Nozaki | |
| 2011/0066028 A1 | 3/2011 | Min | |
| 2011/0299565 A1 | 12/2011 | Jester et al. | |
| 2012/0039357 A1 | 2/2012 | Levesque | |
| 2012/0039358 A1 | 2/2012 | Bosselmann | |
| 2012/0203100 A1 * | 8/2012 | Weiss | A61B 5/0422 600/421 |
| 2012/0268116 A1 * | 10/2012 | Zhu | G01R 33/3692 324/307 |

FOREIGN PATENT DOCUMENTS

| | | |
|---|---|---|
| JP | 2008212437 A | 9/2008 |
| WO | 2010102117 A1 | 9/2010 |
| WO | 2011051872 A2 | 5/2011 |

* cited by examiner

MRI INVOLVING A DISTRIBUTED SENSOR TO MONITOR THE TEMPERATURE AND/OR STRAIN OF COIL CABLES AND TRAPS

CROSS-REFERENCE TO PRIOR APPLICATIONS

This application is the U.S. National Phase application under 35 U.S.C. § 371 of International Application No. PCT/IB2013/059822, filed on Oct. 31, 2013, which claims the benefit of U.S. Provisional Patent Application No. 61/726,735, filed on Nov. 15, 2012. These applications are hereby incorporated by reference herein.

The following relates generally to magnetic resonance arts, sensor arts, safety arts, temperature sensing arts, cable trap arts, mechanical arts, and so forth. It finds particular application in conjunction with distributed temperature, strain, and movement sensing applications.

MR systems produce high resolution 3D images of human anatomy. A subject undergoing a magnetic resonance (MR) procedure such as an MR imaging or spectroscopy procedure is positioned on a patient support in an examination region within a static main magnetic field ($B_0$). RF field ($B_1$) pulses are applied at a magnetic resonance frequency to excite resonance in dipoles of the subject. A transmit coil, for instance a whole body coil, adjacent to the examination region generates the RF pulses in accordance with a selected imaging protocol. In some imaging or spectroscopy procedures, local coils are placed next to the body in various locations to receive RF resonance signals and/or to generate the RF pulses. When used in transmit mode, the local coils focus RF pulses on a specific body part or location. In a receive mode, the local coils receive the weak magnetic resonance decay RF signals and send the received signals to a receiver. The received RF data is reconstructed into one or more images.

In most magnetic resonance imaging (MRI) receive coils, cable traps are incorporated into shielded cables which connect an MRI receive coil to the system for improving image quality. Unwanted currents can be induced the in cable shield. Suppression of these unwanted currents is accomplished using a series of non-magnetic cable traps along the cable. A cable trap can only be electrically measured if it is disconnected from the coil, which is normally not an option. That is, a failing cable trap is not currently able to be detected without being removed from the cable.

Current techniques for detecting a failing or failed cable trap require that the cable trap be removed from the cable, which is a time consuming and expensive process as the shielded cable must be disassembled almost completely. During operations of the MRI, the monitoring of components is not easy. Thus, there is a need for measuring these components on-the-fly. The operator of the MRI scanner may then continue using the MRI scanner until the first signals of a problem with the MRI scanner are received. The unwanted cable currents can result in reduced image quality and/or enhancement in the local transmit fields by too great a degree, which may generate patient discomfort.

Additionally, while a reduction in image quality may result from a failing or failed cable trap, there are other causes not related to the cable traps that may cause the reduction in image quality. Unfortunately, the only current manner in which to rule out the cable traps as the cause is the disassembly and testing referenced above. Thus, even if each trap is removed and checked, the image quality may not be improved such that the disassembly of the cable proves an unnecessary expenditure of time and effort.

The following discloses a new and improved system and method for detecting cable trap failure and temperature flucuations in MR systems which addresses the above-referenced issues, and others.

In accordance with one aspect, a magnetic resonance system includes at least one cable that has at least one optic fiber component. The at least one optic fiber component is in communication with an optical monitoring unit. The optical monitoring unit is configured to determine temperatures at each of a plurality of positions along the at least one optic fiber component. The monitoring unit is also configured to halt an operation of the MR system in response to at least one determined temperature.

In accordance with another aspect, a method for distributed temperature sensing in a magnetic resonance system includes operating a magnetic resonance scanner. The method also includes monitoring temperatures along a length of a optic fiber component of a cable associated with the magnetic scanner. Temperatures are then determined at preselected positions along the optic fiber component.

In accordance with a further aspect, a cable for distributed temperature sensing in a magnetic resonance system includes a cable component and at least one cable trap coupled to the cable component. The cable further includes a optic fiber component in contact with the cable component and the at least one cable trap.

One advantage is an ability to detect failing cable traps on a cable prior to locally too high injected common mode currents.

Another advantage resides in detecting failing cable traps without disassembling the cable to which they are attached.

Another advantage rests in the ability to detect temperature spikes in MR coils.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

Figure 1:
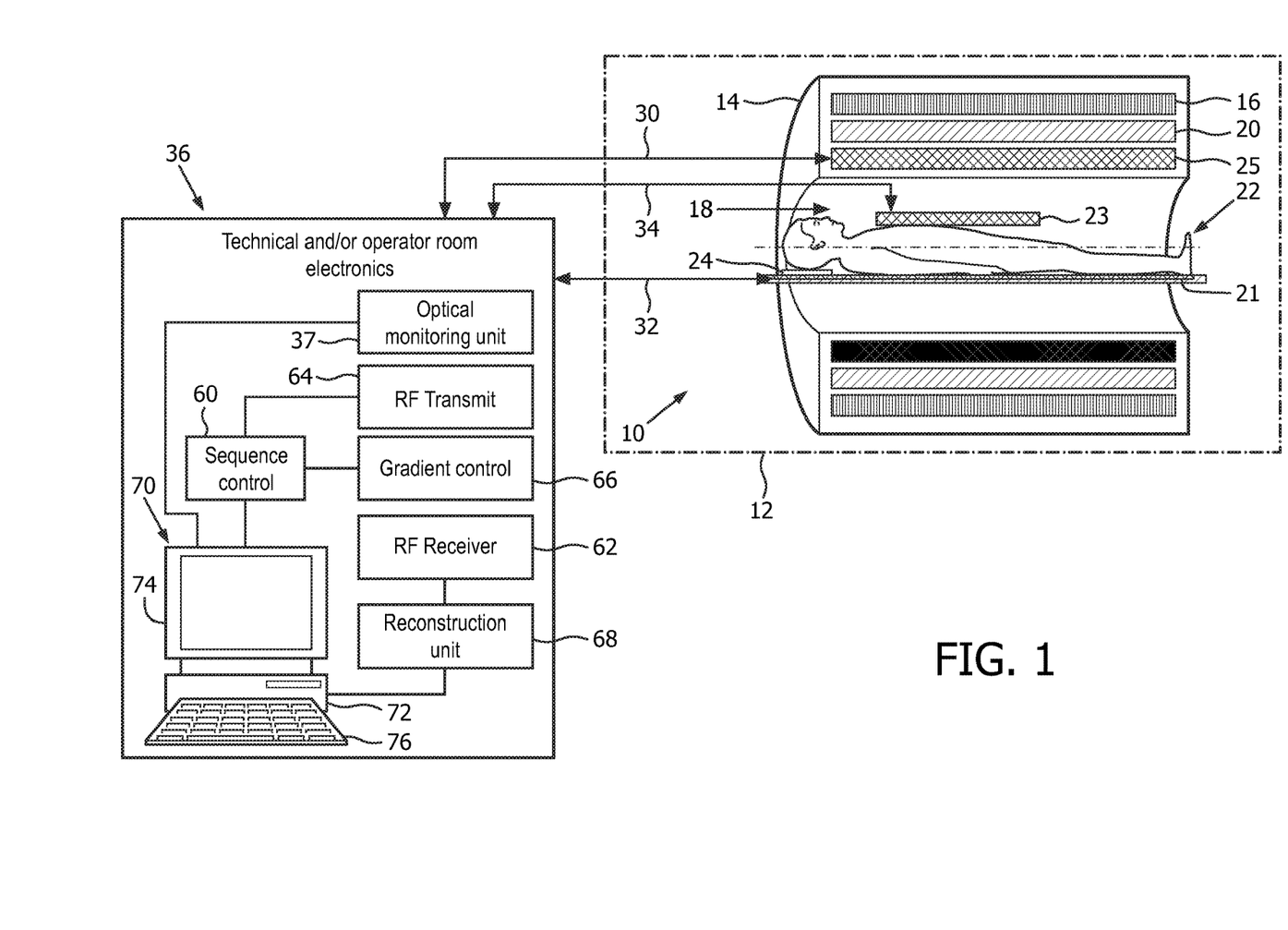
FIG. 1 diagrammatically shows a magnetic resonance (MR) system.

With reference to FIG. 1, a magnetic resonance environment includes a magnetic resonance (MR) scanner 10 disposed in a radio frequency examination room 12 (diagrammatically indicated by a dashed box surrounding the MR scanner 10), for example, comprising a wire mesh or other radio frequency screening structures embedded in or disposed on the walls, ceiling, and floor of the MR room containing the MR scanner 10. The MR scanner 10 is shown in diagrammatic side-sectional view in FIG. 1, and includes a housing 14 containing a main magnet windings 16 (typically superconducting and contained in suitable cryogenic containment, not shown, although a resistive magnet windings are also contemplated) that generate a static ($B_0$) magnetic field in a bore 18 or other examination region. The housing 14 also contains magnetic field gradient coils 20 for superimposing magnetic field gradients on the static ($B_0$) magnetic field. Such gradients have numerous applications as is known in the art, such as spatially encoding magnetic resonance, spoiling magnetic resonance, and so forth. An imaging subject, such as an illustrative patient 22, or an animal (for veterinary imaging applications), or so forth is loaded into the examination region (inside the bore 18 in the illustrative case) via a suitable couch 24 or other patient support/transport apparatus. The MR scanner 10 may include numerous additional components known in the art which are not shown for simplicity, such as optional steel shims, a whole body radio frequency (RF) coil 21 disposed in the housing 14, and so forth. The MR scanner 10 also typically includes numerous auxiliary or ancillary components again not shown for simplicity, such as power supplies for the main magnet 16 and the magnetic field gradient coils 20, built-in RF coils 21, optional local RF coils 23 (e.g. surface coils, a head coil or limb coil, or so forth), a whole body built in coil 25, RF transmitter and RF reception hardware, and various control and image reconstruction systems, by way of some examples. Moreover, it is to be understood that the illustrative MR scanner 10, which is a horizontal-bore type scanner, is merely an illustrative example and that more generally the disclosed MR cables 30, 32, and 34 are suitably employed in conjunction with any type of MR scanner (e.g., a vertical bore scanner, open-bore scanner, or so forth).

The system of FIG. 1 further includes technical and/or operator room electronics 36 in communication with the examination room via assorted communications links including cables 30, 32, and 34, wireless communication links, or a combination thereof. The system includes a sequence controller 60, an optical monitoring unit 37, and a Radio Frequency (RF) receiver unit 62. The sequence controller 60 controls the operation of the imaging sequence which includes an RF transmitter unit 64 controlling the operation of the RF coils 21, 23 and a gradient controller 66 controlling the operation of the gradient coils 20. The communication between the technical and/or operator room electronics 36 (i.e., the control components) and the corresponding coils 20, 21, 23 may be wireless or wired, e.g., the cables 30, 32, 34, or the like. In one embodiment, optic fibers associated with the cables 30, 32, and 34 and the coils 21, 23, 25, (shown in FIG. 2) are monitored by the optical monitoring unit 37, which is configured to detect temperatures along the cables 30, 32, and 34 or within the coils 21, 23, 25, positions of such temperature on the respective cable 30, 32, 34, or coil 21, 23, 25, strain in the cables 30, 32, 34, position/movement of the subject 22, and the like, as discussed below. Additional cables may be included within other system hardware for monitoring positions, temperatures, and/or strains therein, e.g., gradient coil, gradient amplifier, patient support 24, or other system components inside or outside of the direct RF environment.

The RF transmitter unit 64 may work cooperatively with the local coil 23 when configured as a transmit/receive coil. The RF receiver 62 receives RF data from local coil indicative of the magnetic resonance excited in the tissue of the subject 22. The RF data can be communicated between the whole body coil 25, the local coil 23, the coil 21, or the like, and the RF receiver 62 wirelessly or via a wired connection. With a wireless connection, the power is used from an induced current or a separate power source to transmit RF data. With a wired connection, the wire can operationally supply power for amplification and carry the resonance signal. A reconstruction unit 68, such as a processor, receives the RF data from the RF receiver 62 and reconstructs one or more images from the received data.

In operation, the main magnet 16 operates to generate a static $B_0$ magnetic field in the examination region 18. RF pulses are generated by the RF system (including for example a transmitter and one or more RF coils disposed in the bore or a whole-body RF coil in the housing 14) at the Larmor frequency (i.e., magnetic resonance frequency) for the species to be excited (usually protons, although other species may be excited, e.g. in MR spectroscopy or multinuclear MR imaging applications). These pulses excite nuclear magnetic resonance (NMR) in the target species (e.g., protons) in the subject 22 which are detected by a suitable RF detection system (e.g., a magnetic resonance coil or coils and suitable receiver electronics). Magnetic field gradients are optionally applied by the gradient coils 20 before, during, and after excitation, during a delay period (e.g., time to echo or TE) period prior to readout, and/or during readout in order to spatially encode the NMR signals. The reconstruction unit 68 applies a suitable reconstruction algorithm comporting with the chosen spatial encoding in order to generate a magnetic resonance image which may then be displayed, rendered, fused or contrasted with other MR images and/or images from other modalities, or otherwise utilized.

The system includes a workstation 70, which may include an electronic processor or electronic processing device 72, a display 74 which displays the images, menus, panels, and user controls, and at least one input device 76 which inputs the healthcare practitioner selections. The workstation 70 may be a desktop computer, a laptop, a tablet, a mobile computing device, a smartphone, and the like. The input device 76 may be a keyboard, a mouse, a microphone, or the like.

The various units or controllers 60-68 are suitably embodied by an electronic data processing device(s), such as the electronic processor or electronic processing device 72 of the workstation 70, or by a network-based server computer operatively connected with the workstation 70 by a network, or so forth. Moreover, the disclosed reconstruction and system operation are suitably implemented as a non-transitory storage medium storing instructions (e.g., software) readable by an electronic data processing device and executable by the electronic data processing device to perform the disclosed reconstruction and system operation. The display 74 or display device as used herein encompasses an output device or a user interface adapted for displaying images or data. The display 74 may output visual, audio, and/or tactile data.

Figure 2:
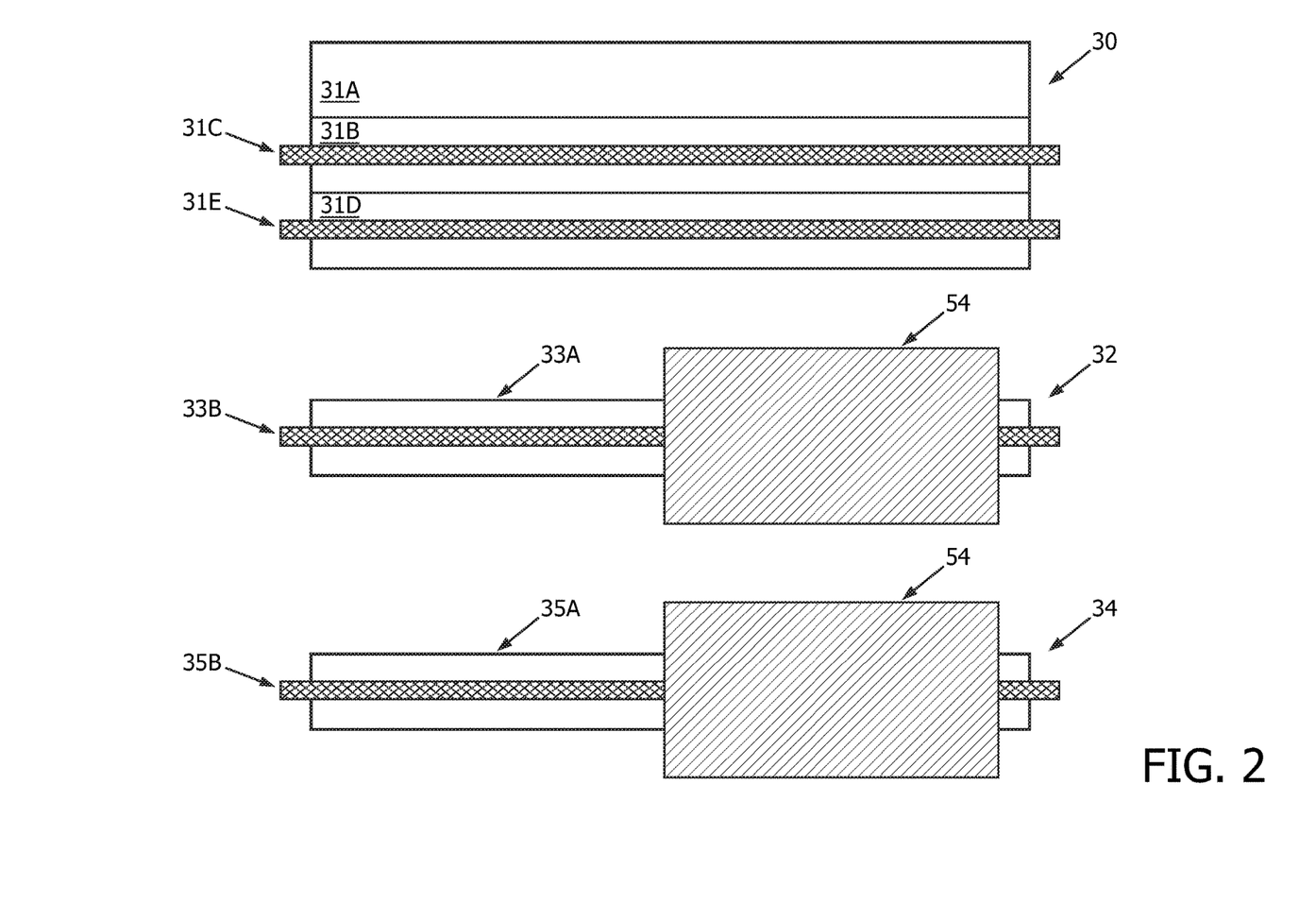
FIG. 2 diagrammatically shows cables with optic fibers in accordance with one embodiment disclosed herein.

FIG. 2 provides a diagrammatic view of the cables 30, 32, and 34 used the system of FIG. 1. As shown in FIG. 2, the cables 30, 32, and 34 respectively comprise cable components 31A, 31B, 31D, 33A, and 35A, and optic fiber components 31C, 31E, 33B, and 35B. In addition, shielded cables 32 and 34 include one or more cable traps 54. It will be appreciated that although not illustrated in FIG. 2 as including a cable trap 54, the cable 30 may also be implemented with one or more cable traps 54. It will further be appreciated that while illustrated in FIG. 2 as shielded, the cables 30, 32, and 34 may be implemented as shielded or unshielded, depending upon the position and application of the cables 30, 32, and 34. The cable components 31A, 31B, 31D, 33A, and 35A suitably include conductive and insulating components configured to carry current, signals, etc., to the coils, 21, 23, 25 from the respective technical and/or operator room electronics 36. In some embodiments, the cables 30, 32, and 34 may come into direct contact with or close proximity to the subject 22, through sensitive components of the MR scanner 10, the coils 20, 21, 25, and the like. Accordingly, the cables 30, 32, and 34 further include one or more optic fiber components 31C, 31E, 33B, and 35B running concurrently along and directly in contact with the respective cable component 31A, 31B, 31D, 33A, and 35A. The optic fiber components 31C, 31E, 33B, and 35B may be through the center of the respective cable components 31A, 31B, 31D, 33A, and 35A with electrical conductors surrounding it, alongside the cable components 31A, 31B, 31D, 33A, and 35A but within the insulating exterior. In other embodiments, the optic fiber components 31C, 31E, 33B, and 35B may be split from or joined to the cable components 31A, 31B, 31D, 33A, and 35A at specified locations, e.g., as shown in FIGS. 3-5B.

The optic fiber components 31C, 31E, 33B, and 35B are coupled to the optical monitoring unit 37, which is configured to monitor the temperature and strain of the cables 30, 32, and 34 throughout their respective lengths, as well as other positions on the optic fiber components 31C, 31E, 33B, and 35B in different regions of the MR scanner 10, as illustrated in FIGS. 3-5B. In one embodiment, the optical monitoring unit 37 may utilize swept wavelength interferometry (SWI) to measure the Rayleigh backscatter as a function of the respective lengths of the optic fiber components 31C, 31E, 33B, and 35B. Temperature or strain changes external to the optic fiber components 31C, 31E, 33B, and 35B result in temporal and spatial shifts in the local Rayleigh backscatter patterns. These shifts may be measured and scaled to provide a distributed temperature or strain measurement on the optic fiber components 31C, 31E, 33B, and 35B. In some embodiments, the optical monitoring unit 37 may be configured to localize temperature or strain down to a 2 mm position along the entire lengths of the optic fiber components 31C, 31E, 33B, and 35B. See, for example, U.S. Pat. Nos. 6,366,722, 7,330,245, 7,440,087, 7,538,883, 7,772,541, 8,004,686. Other methods for detecting temperature and/or strain along the lengths of the optic fiber components 31C, 31E, 33B, and 35B may also be used in accordance with the present disclosure, e.g., using the Stokes line, the anti-Stokes line, and the like. The monitoring unit 37 can include a lookup table with associated positions with specific traps 54 or loops within a coil, 20, 21, 23, 25, respective threshold temperatures, and the like.

As indicated, the optic fiber components 31C, 31E, 33B, and 35B allow for the monitoring of cable traps 54, cables 30, 32, 34, and gradient cable (not shown), temperatures during operation of the MR system 10. Temperature or strain fluctuations detected during this monitoring may indicate that the electromagnetic energy close to the subject 22 exceeds SAR limits (i.e., the amount of electromagnetic energy) and increases the risk of burns on the subject 22. Other indications reflect the comfort level of the subject 22 and the correct functioning of the cable traps 54, as discussed herein. Furthermore, monitoring of the temperature of the local coil 23 may indicate the ambient temperature of the subject 22, the air temperature of the bore in which the subject 22 is placed, or the temperature of the whole body coil 25. Similar solutions on other places can bee added.

Figure 3:
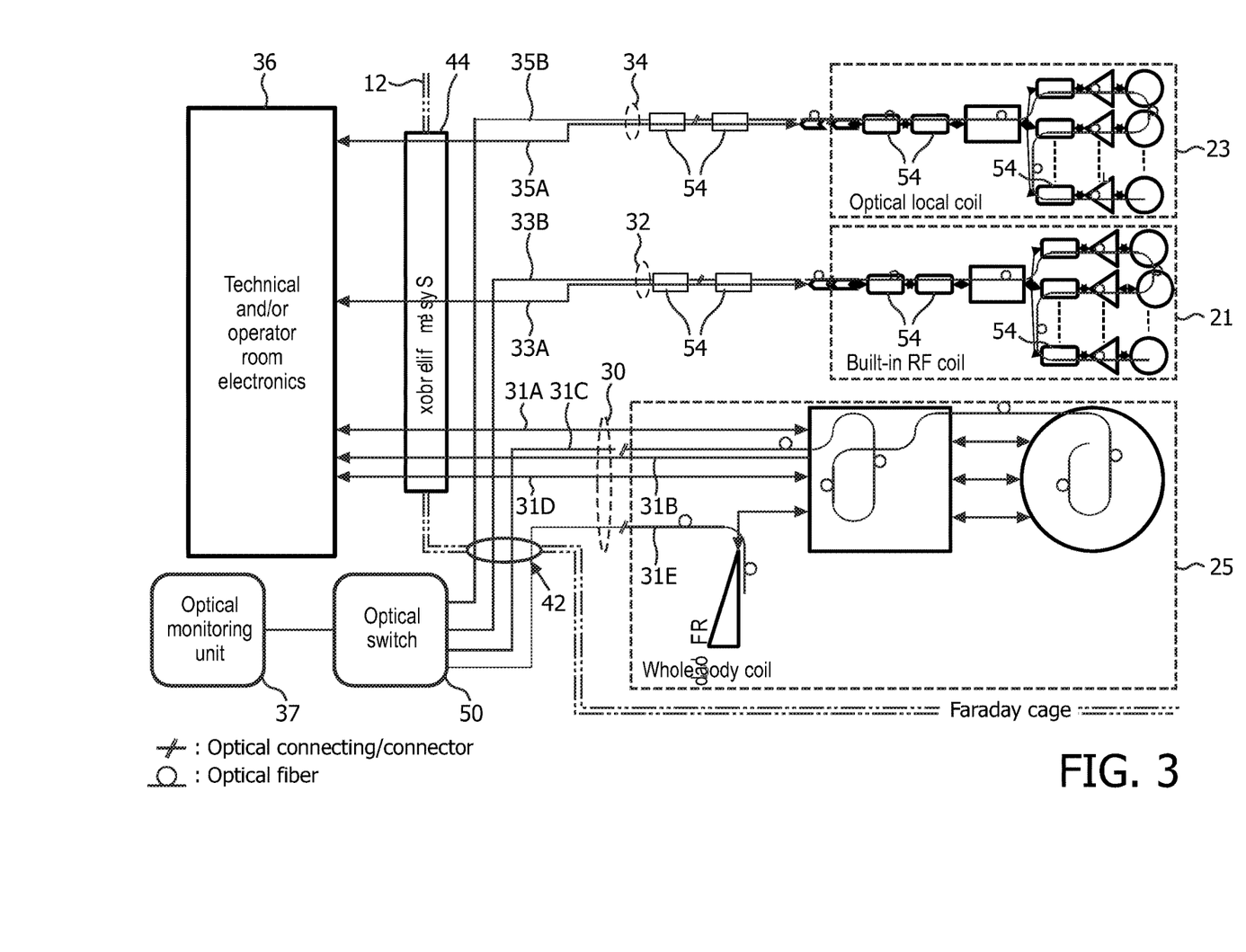
FIG. 3 diagrammatically shows a distributed temperature sensor operative in the MR system of FIG. 1.

With reference to FIG. 3, and with reference to FIGS. 1 and 2, a schematic diagram of the system of FIG. 1 is illustrated. The illustration depicts the optional local coil 23, the built-in coil 21 such as a spinal coil built into the support 24, and a quadrature whole body coil 25 operatively connected to the technical and/or operator room electronics 36 (via cable components 31A, 31B, 31D, 33A, and 35A) through a system filter box 44 (a suitable filter component to remove transients and other interference from the MR data), an optical switch 50 (via optic fiber components 31C and 31E, 33B, and 35B), and the optical monitoring unit 37. It will be appreciated that while shown as being outside the examination room 12, the optical switch 50 may be positioned within the examination room 12 with the output therefrom coupled through an optical feed through 42 to the optical monitoring unit 37.

Figure 4:
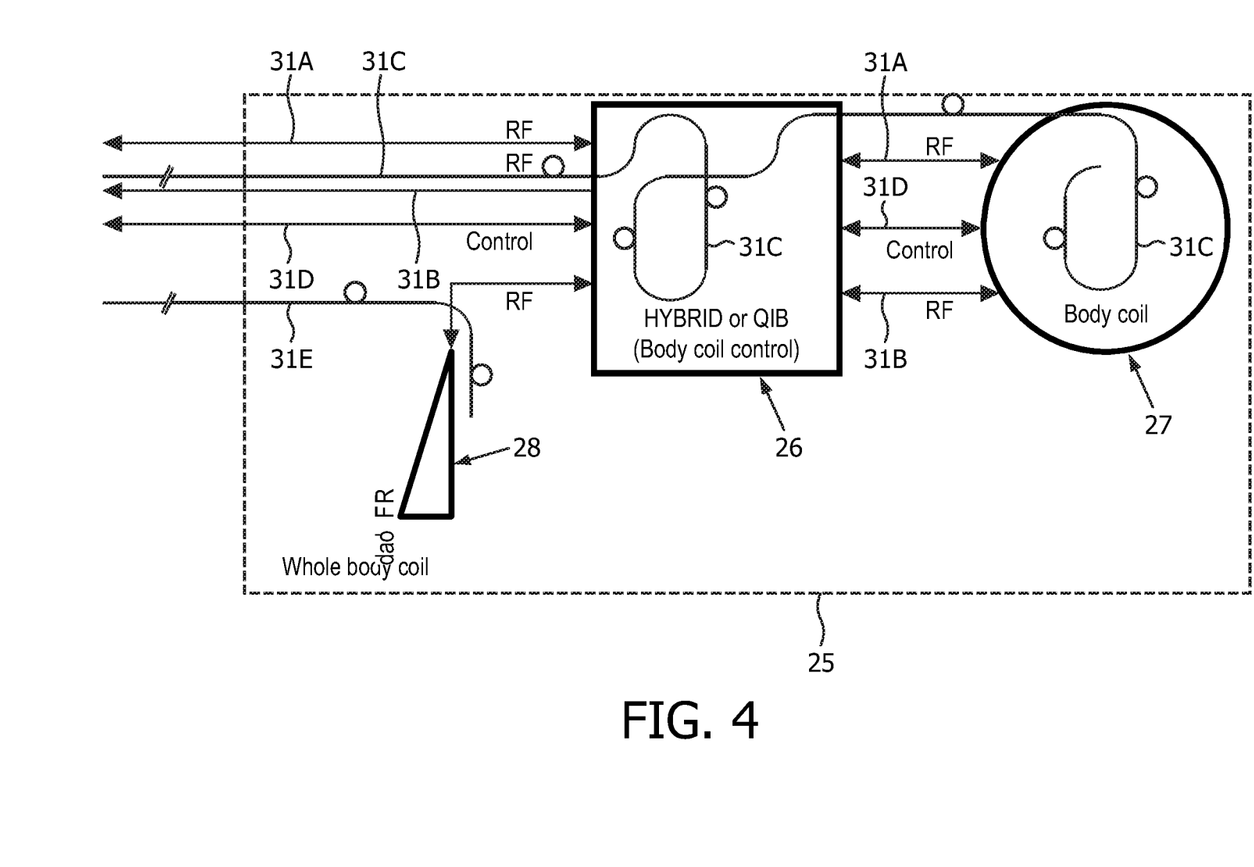
FIG. 4 diagrammatically shows a detailed view of a built in whole body coil with distributed temperature sensing optic fiber of FIG. 3.

As shown, in greater detail in FIG. 4, cable components 31A, 31B, and 31D couple the loops 27 of the whole body coil 25 to the control 26 and thereby to the technical and/or operator room electronics 36 as shown in FIG. 3. Running throughout the coil loops 27 and the control 26 is the optic fiber component 31C, which provides temperature and strain information to the optical monitoring unit 37 as discussed above. It will be appreciated that the optic fiber component 31C may be placed in contact with each loop 27 of the whole body coil 25 via the folding of the optic fiber component 31C along all body coil parts. A second optic fiber component 31E is in communication with the RF load 28, which provides temperature and strain information relative to this component of the built in whole body coil 25. The optic fiber components 31C and 31E exit the examination room 12 via the optical feed through 42 to the optical switch 50, resulting in the temperatures/strain associated with the operation of the whole body coil 25 being communicated to the monitoring unit 37. Because the whole body RF coil 25 is accessed with leads from its exterior that are outside the examination region and because the whole body RF coil 25 leads (e.g., cable 30) do not touch or come into close proximity with the subject 22, fewer traps 54 may be needed. However, the optic fiber components 31C and 31E are still capable of providing valuable system diagnostic information.

Figure 5A:
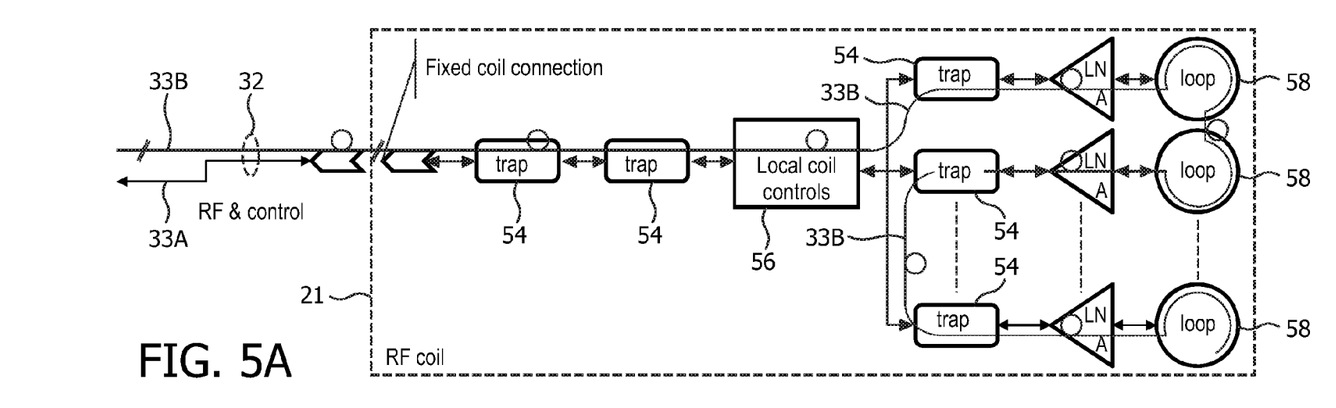
FIGS. 5A-5B illustrate diagrammatically detailed views of the optional local coil and the optional RF coil with distributed temperature sensing optic fiber of FIG. 3.

With reference to FIG. 5A, the optional built in RF coil 21 is operatively coupled to the technical and/or operator room electronics 36 through the system filter box 44 (via cable component 33A), the optical switch 50 (via optic fiber component 33B), and thereby to the optical monitoring unit 37. FIG. 5A provides a detailed view of the optional built in RF coil 21 and shielded cable 32, which depicts the cable traps 54 of the cable 32, the controls 56 associated with the optional built in RF coil 21, and the loops 58 contained within the optional built in RF coil 21. As shown, the optic fiber component 33B is suitably wound within and throughout the loops 58 of the optional built in RF coil 21, the traps 54, and the controls 56. In this manner, the optic fiber component 33B may be used to detect the temperature/strain at any position within the optional built in RF coil 21, e.g., within a specific loop 58, within the controls 56, within a specific cable trap 54, and the like. Accordingly, the optic fiber component 33B is output through the examination room 12 via the optical feed through 42 to the optical switch 50, which sends the temperature/strain information to the optical monitoring unit 37.

Figure 5B:
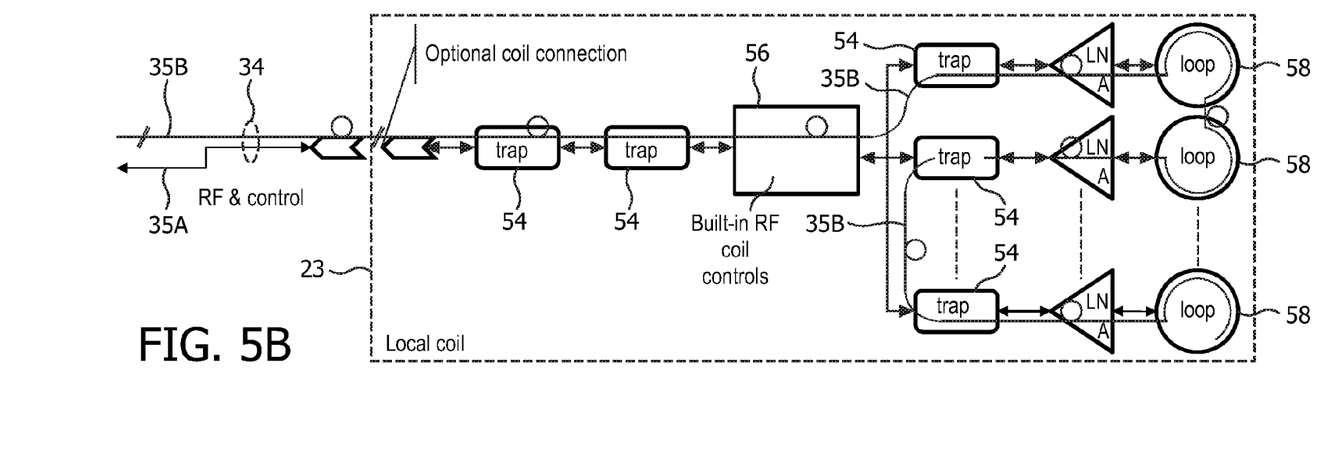

Similarly, the optional local coil 23 may be in communication with the technical and/or operator room electronics 36 (using cable component 35A of the cable 34) through the system filter box 44, with the optical switch 50 (using the optic fiber component 35B of the cable 34), and thus the monitoring unit 37, as shown in FIG. 5B. As previously discussed with respect to the optional built in RF coil 21, the optional local coil 23 may include the optic fiber component 35B wound throughout each loop 58, controls 56, and each cable trap 54 of the shielded cable 34 until splitting off to the optical feed through 42. In this manner, the temperature/strain along any position of the cable 34 may be ascertained, particularly those positions corresponding to the cable traps 54 and/or those positions in contact with the subject 22. Accordingly, the mechanical strain in flexible coils, e.g., the optional local coil 23, may be determined so as to ensure that the cable 34 and coil 23 remain in optimal condition for operation. It will thus be appreciated, that the strain capable of being detected via the optic fiber components 31C, 31E, 33B, and 35B may be used to detect movement and/or position of the subject 22 during operation of the MR system 10.

Although referenced above as pertaining to the the RF coil 21, the local coil 23, and the whole body coil 25, the use of the optic fiber components 31C, 31E, 33B, and 35B is capable of providing hot spot monitoring during operations of the MR system 10 on other critical components such as, for example, PIN diodes, RF amplifiers, RF screens, capacitors, PCB traces in detune circuits, and the like. Such monitoring, in addition to detecting possible failures of such components, also provides reliability information in an early state, i.e., while the circuits are functioning properly, and allows for remote preventative maintenance. Other monitoring of non-critical components of the MR system 10 is also contemplated herein, including, for example, drive motors associated with the patient support 24, other electronics within the room 12, those surfaces of the MR system 10 with which either the subject 22 or the healthcare operator has physical contact, e.g., mainting surface temperatures within industry standards such as the UL surface temperature requirements associated with a quadrature body coil, couch 24, examination region 18, housing 14, etc. It will be appreciated that the temperature and/or strain information collected via the optic fiber components 31C, 31E, 33B, and 35B may also provide performance indicators for the MR protocol that heats up such components, be used for remote performance diagnosis of the system 10, and the like. Furthermore, the monitoring of strain information may be used to monitor movement of the subject 22 in real time, as from the strain back-scatter the actual fiber bending/position may be calculated. For example, when the optic fiber component 35B of the local coil 23 is in close contact with the subject 22 (e.g., in the surface of some RF coils), the movement of the subject 22 may be calculated. It will will be appreciated that such an implementation will provide real time information on the position and movement of the subject 22, which may be used in processing any MR data received so as to improve image quality.

Figure 6:
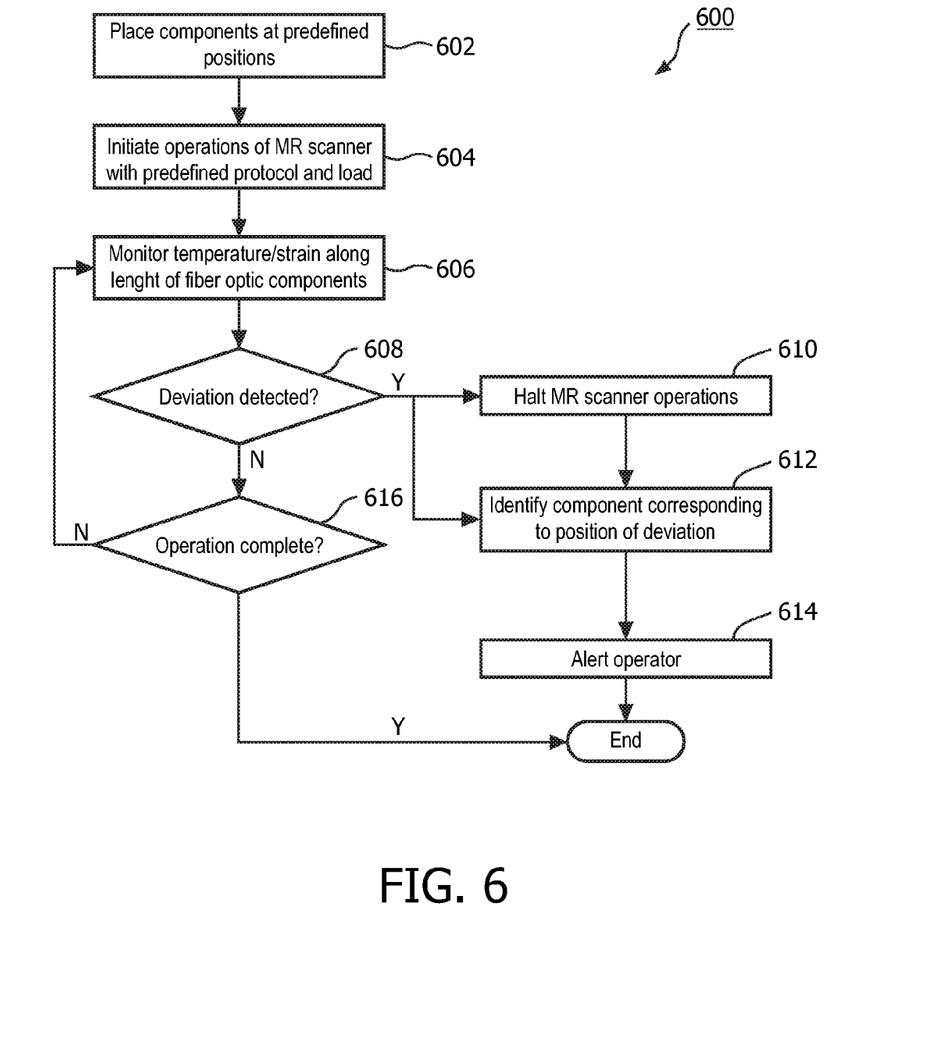
FIG. 6 flowcharts a method for monitoring the performance of coil cables and traps using distributed temperature sensing in accordance with one embodiment disclosed herein.

Referring now to FIG. 6, there is shown a flowchart 600 illustrating a method for monitoring the performance of coil cables and traps using distributed sensing according to one embodiment of the present disclosure. At step 602, each coil 20, 21, 23, 25, cable 30, 32, and 34, support apparatus (e.g., couch 24), and other components of the MR scanner subject to influence by the RF fields and including an optic fiber component, are placed at predefined positions relative to the MR scanner 10. The predefined positions may be determined in accordance with manufacturer specifications, standard operating procedures, strain minimization techniques, etc.

Figure 7:
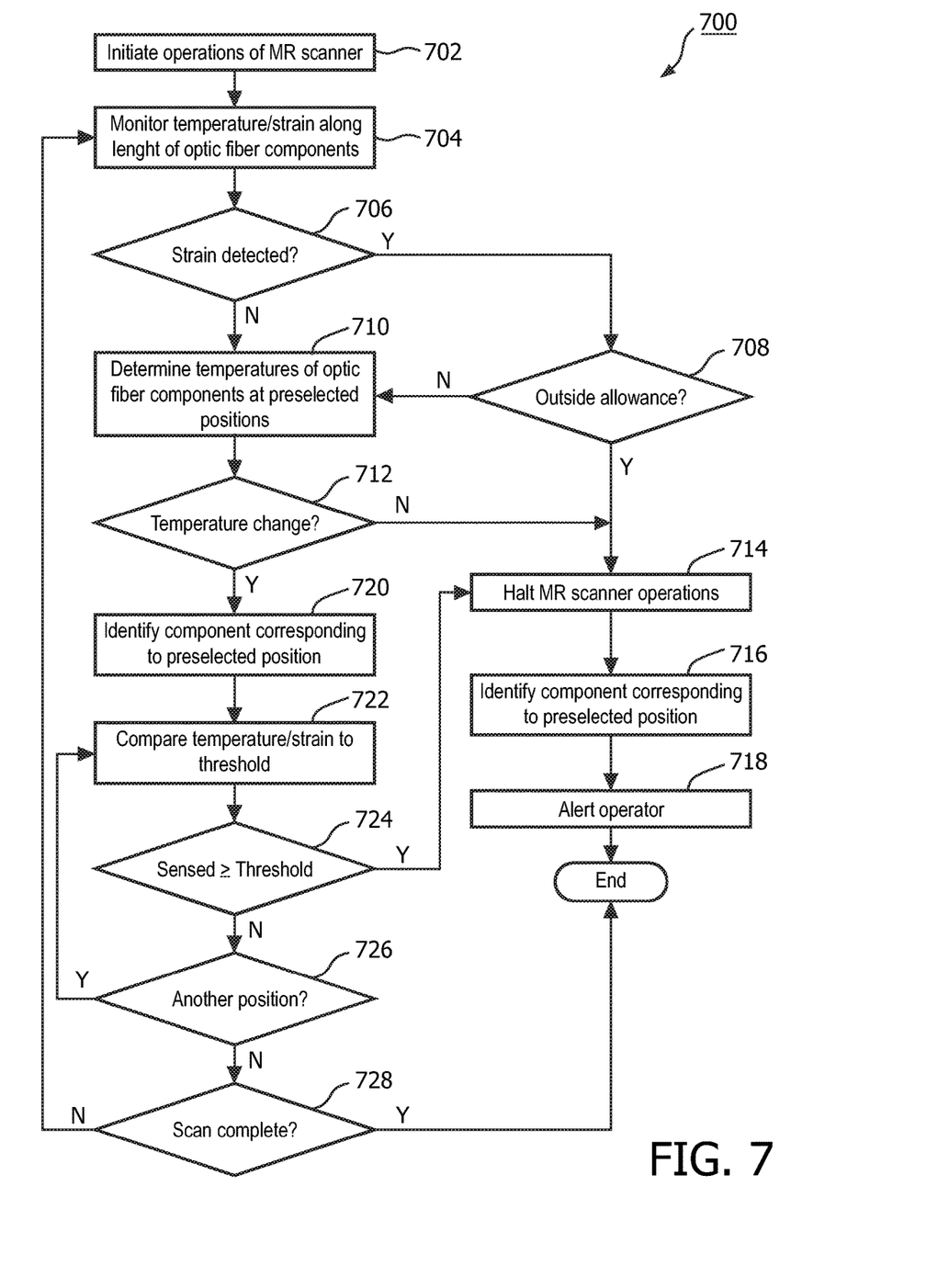
FIG. 7 illustrates an example implementation of the method for monitoring the performance of coil cables and traps using distributed temperature sensing in 20 accordance with one embodiment disclosed herein.

At a step 604, operation of the MR scanner 10 is initiated. For example purposes, reference is made hereinafter with respect to FIG. 6 as operations relating to a preventative maintenance, new component addition to the MR scanner 10, or verification of an alert (as generated in FIG. 7, discussed in greater detail below). FIG. 7, discussed below, provides an example implementation of the subject systems and methods for active scanning operations of the MR scanner 10 with respect to the scan of the subject 22.

According, the operation of the MR scanner 10 initiated at 604 may include a predefined scanning protocol with a predefined load, e.g., empty. Such an operation may be used to identify components of the MR scanner 10 that have failed or are in the process of failing, to determine whether a detected deviation in temperature or strain is the result of improper positioning of a component or the subject 22, etc. Thus, at a step 606, the temperatures/strains along each optic fiber component 31C, 31E, 33B, and 35B are monitored by the optical monitoring unit 37 consistent with the type of operation initiated at step 604, e.g., normal scanning, preventative maintenance, MR scanner 10 modifications, alert verification, etc.

A determination is then made at a step 608 whether any deviation in the sensed strain or temperature is detected along any of the optic fiber components 31C, 31E, 33B, and 35B being monitored. An example deviation detection during a normal scan of a subject 22 is set forth in steps 706, 708, 712, 720, 722, 724, and 726 of FIG. 7, discussed in greater detail below. With respect to FIG. 6, the deviation detected during maintenance or verification (cross-checking) scanning operations, may include any deviation in temperature/strain beyond a predetermined amount from the temperature expected with the above-identified pre-defined positions, load, scanning protocol, etc. In the event that no deviation is detected at step 608, a determination is made at step 616 whether the operation of the MR scanner 10, e.g., the scanning operation, maintenance or verification operation, has completed. If the operation has not yet completed, flow returns to the monitoring of the components at step 606. Operations with respect to FIG. 6 terminate after completion of the operation of the MR scanner 10 as determined at step 616.

Upon a determination at step 608 that a deviation in either strain or temperature has been detected along an optic fiber component 31C, 31E, 33B, and 35B, operations proceed to optional step 610 or step 612. That is, in the event that the deviation detected is an exceedingly higher or lower temperature than expected, greatly diminished image quality, etc., a halt in operation of the MR scanner 10, may be warranted at step 608. In the event that the deviation detected does not warrant a halt in operations, or after a halt in operations, the component (if any) corresponding to the position of the detected deviation is identified at step 612. The identification may include, for example, a position along the optic fiber component 31C, 31E, 33B, and 35B, a component through which the optic fiber component 31C, 31E, 33B, and 35B is placed corresponding to the position on the optic fiber component 31C, 31E, 33B, and 35B, or the like. The operator associated with the MR scanner 10 may then be alerted of the deviation and the position and/or component, at step 614 via an audible alert, visual alert, message alert, or any suitable combination thereof.

It will be appreciated that the procedure set forth above may be used during the intial setup of a new component, e.g., new cable, coil, etc., for the MR scanner 10. In such an initial setup, threshold temperatures may be established in order to gauge deviations therefrom during operations and maintenance. Accordingly, the detected threshold temperatures may subsequently be used to determine the proper functioning of the component during scanning, maintenance, or verification operations, i.e., the monitoring and scanning of steps 606 and 608. Additionally, the positions associated with the components, MR scanner 10 protocol, load, temperature, etc., may be used as the predefined positions, temperatures, etc., for verification of an alert (cross-checking) or detecting a deviation during maintenance operations. For example, after a predetermined amount of time, the new component, such as a coil, may be checked during a maintenance operation with the temperatures detected therein compared against the initial temperatures for any differences, which may be indicative of a failed component or a component drifting out of accepted specification.

Turning now to FIG. 7, there is shown a flowchart 700 illustrating an example implementation of the method for monitoring the performance of coil cables and traps using distributed sensing set forth in FIG. 6. At a step 702, operation of the MR scanner 10 is initiated on the subject 22. At a step 704, the temperatures/strains along each optic fiber component 31C, 31E, 33B, and 35B are monitored by the optical monitoring unit 37. A determination is then made at a step 706 whether a strain is detected along any of the optic fiber components 31C, 31E, 33B, and 35B being monitored. Upon a positive determination at a step 706, operations proceed to a step 708, whereupon a determination is made whether the strain detected exceeds any allowance designated for the optic fiber component 31C, 31E, 33B, and 35B. It will be appreciated that such strain allowance may be greater for the optic fiber component 35B associated with the moveable local coil 23 than the allowance of the optic fiber components 31C and 31E associated with the whole body coil 25. Upon a positive determination at step 708, flow proceeds to a step 714, whereupon operation of the MR scanner 10 is terminated. The technical and/or operator room electronics 36 in conjunction with the optical monitoring unit 37 then identifies the cable 30, 32, 34, components thereof, other components of the MR scanner 10, etc.) at the position for which the detected strain exceeds the corresponding strain allowance at a step 716. At step 718, the healthcare operator is alerted, e.g., audible alert, visual indication of position, alarm, etc. Operations with respect to FIG. 7 then terminated having provided the operator with an indication of the position of a problem with the MR scanner 10. It will be appreciated that the verification procedure discussed above with respect to FIG. 6 may be used herein to verify that the alert generated is due to a failed or failing component and not, for example, due to the improper connection of a cable 30, 32, 34, the improper positioning of the subject 22 or couch 24, improper scanning protocol for one of the coils 20, 21, 23, 25, or other improper positioning issues, so as to avoid false alarms and unnecessary replacement/repair costs.

Upon a negative determination at either step 706 or step 708, operation of the MR scanner 10 illustrated in FIG. 7 proceeds to a step 710. The optical monitoring unit 37 or other suitable component associated with the system, e.g., the technical and/or operator room electronics 36, determines, at step 710, the temperatures at predetermined positions along the lengths of the optic fiber components 31C, 31E, 33B, and 35B.

A determination is then made at a step 712 whether no change in temperature is detected at any position on the optic fiber component 31C, 31E, 33B, and 35B. That is, a position along the length of the optic fiber component 31C, 31E, 33B, and 35B is not registering a temperature change (e.g., an increase in temperature) while RF energy is applied, which application normally results in an increase in the temperature of the component 31C, 31E, 33B, and 35B. Accordingly, the detection of no change in temperature may be indicative of a non-RF dissipating component which is likely not functioning as intended. Upon a determination that at least one position is not registering a change in temperature, flow proceeds to step 714, whereupon operation of the MR scanner 10 is terminated. The technical and/or operator room electronics 36 in conjunction with the optical monitoring unit 37 then identifies the component (e.g., the the built-in RF coil 21, the local coil 23, the whole body coil 25, components thereof, other components of the MR scanner 10, etc.) at that position for which no change in temperature is detected at step 716. At step 718, the healthcare operator is alerted, e.g., audible alert, visual indication of position, alarm, etc. Operations with respect to FIG. 7 then terminated having provided the operator with an indication of the position of a problem with the MR scanner 10.

Returning to step 712, when it is determined that temperature changes have been detected at all predetermined positions of the optic fiber components component 31C, 31E, 33B, and 35B, flow proceeds to step 720. At step 720, a component (e.g., the built-in RF coil 21, the local coil 23, the whole body coil 25, components thereof, other components of the MR scanner 10, etc.) first position on the optic fiber component 31C, 31E, 33B, and 35B is identified and the temperature at that position is isolated. The isolated temperature is then compared to a preselected threshold temperature (indicating normal operation) at step 722. It will be appreciated that different positions along the length of the optic fiber component 31C, 31E, 33B, and 35B may have different threshold temperatures in accordance with the function of the component to which the optic fiber component 31C, 31E, 33B, and 35B are coupled, e.g., the temperature in the loops 58 may be substantially higher during normal operation than the temperature of the cable traps 54, or portions of the local coil 23 in contact with the subject 22. It will be appreciated that the monitored temperatures along the length of the optic fiber component 31C, 31E, 33B, and 35B may be influenced by the MR protocols being used, as well as the cable/coil positions with respect to the transmit field $B_1$. Thus, in embodiments contemplated herein, each protocol may have individual thresholds set, an overall covering threshold may be used, and the like.

A determination is then made at step 724 whether the isolated temperature is greater than or equal to the preselected threshold temperature associated with that position. Upon a determination that the isolated temperature exceeds the threshold temperature, operations proceed to step 714, whereupon operations of the MR scanner 10 are terminated and the operator is alerted, as set forth above. It will be appreciated that operations of the MR scanner 10 may continue upon detection of abnormal, but non-dangerously high temperatures. In such an embodiment, the MR scanner 10 will continue functioning, but a report or alert warning the operator of the temperature increase is generated. Upon a determination that the isolated temperature is less than the threshold temperature, a determination is made at step 726 whether another position remains for analysis. It will be appreciated that the foregoing enables testing to determine whether a coil 20, 21, 23, 25 is functioning as expected, or other whether some other mechanism is causing the halting system. In order to determine this, the coil 20, 21, 23, 25 may be checked in a predefined position and with a predefined protocol, for which the strain and temperature are known, and deviation for more than some threshold may be indicative of an issue with the coil 20, 21, 23, 25 under observation. Upon a positive determination at step 726, operations return to step 722, whereupon a temperature isolated for that position is compared to its corresponding threshold temperature. In the event that no additional positions remain, operations proceed to step 728, whereupon a determination is made whether the operation of the MR scanner 10 has completed. In the event that the scan being conducted by the MR scanner 10 is still in progress, operation returns to step 704, whereupon monitoring of temperatures of the components of the MR scanner 10 via the optic fiber component 31C, 31E, 33B, and 35B continues as set forth above.

It will be understood that steps 706, 708, 712, 720, 722, 724, and 726 are representative of the deviation determination 606 of FIG. 6. It will be appreciated that the above-identified steps may be performed sequentially as shown in FIG. 7, in parallel (both strain and temperature conducted simultaneously), or only one or the other may be performed. Thus, the implemetnation depicted in FIG. 7 is intended as one illustrative example of the systems and methods described above with respect to FIGS. 1-6.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance (MR) system, comprising:
   at least one cable including at least one optic fiber component; and
   an optical monitoring unit in communication with the at least one optic fiber component, the optical monitoring unit being configured to:
   determine temperatures as determined temperatures at each of a plurality of positions along the at least one optic fiber component, using swept wavelength interferometry (SWI), or a Stokes line, or an anti-Stokes line;
   identify threshold temperatures for each of the plurality of positions; and
   selectively identify an abnormal operation of the magnetic resonance system based on comparing the determined temperatures at each of the plurality of positions and a different threshold temperature corresponding to each of the plurality of positions.

2. The system according claim 1, wherein the optical monitoring unit is configured to:
   identify at least one part corresponding to a preselected position on the at least one optic fiber component corresponding to the determined temperature; and
   generating an alert indicative of the identified part and determined temperature.

3. The system according to claim 1, further comprising at least one cable trap coupled to the at least one cable, the at least one optic fiber component extending through the cable trap to measure temperature therein.

4. The system according to claim 1, wherein the at least one cable further includes at least one cable component.

5. The system according to claim 4, wherein the at least one optic fiber component is coupled to the at least one cable component along a length of the at least one cable.

6. The system according to claim 2,
   wherein the optical monitoring unit is configured to determine at least one of the plurality of positions has no change in temperature, and to generate at least one of a report and a warning responsive to at least one position lacking a change in temperature.

7. The system according to claim 6, wherein the at least one part is selected from the group consisting of a built-in RF coil, a local coil, and a whole body coil.

8. The system according to claim 7, wherein the optical monitoring unit is configured to halt an operation of the MR system responsive to at least one determined temperature.

9. The system according to claim 8, wherein the local coil is in contact with a subject, and wherein the optical monitoring unit is configured to detect a temperature of the local coil in contact with the subject.

10. The system according to claim 1, wherein the at least one cable is in contact with a subject, and wherein the optical monitoring unit is configured to detect a temperature along the at least one cable in contact with the subject.

11. The system according to claim 1, wherein the optical monitoring unit is further configured to:
    determine a strain along the at least one optic fiber component,
    halt an operation of the MR system responsive to at least one determined strain exceeding a predetermined strain allowance associated with the at least one optic fiber component.

12. A method for distributed temperature sensing in a magnetic resonance (MR) system, comprising:
    operating an MR scanner;

measuring Rayleigh backscattering, or a Stokes line, or an anti-Stokes line to monitor temperatures along a length of an optic fiber component of a cable associated with the MR scanner;

determining temperatures at each of a plurality of preselected positions along the optic fiber component; and selectively identifying an abnormal operation of the magnetic resonance system based on comparing determined temperatures at each of the preselected positions and a different threshold temperature for each of the preselected positions.

13. The method according to claim 12, further comprising:

determining the determined temperature is greater than or equal to the threshold temperature; and generating at least one of a report and a warning responsive to the determined temperature being greater than or equal to the threshold temperature.

14. The method according to claim 12, further comprising:

determining that no temperature change is detected at a preselected position along the optic fiber component; and halting operation of the MR scanner responsive to the determining that no temperature change was detected.

15. The method according to claim 14, wherein the MR scanner is operated in accordance with at least one of a preventative maintenance or verification procedure, and the method further comprises:

positioning at least one part at a predefined position relative to the MR scanner;

operating the MR scanner in accordance with a predefined scanning protocol and a predefined load; and detecting at least one deviation from an expected temperature for the at least one part at the predefined position, protocol, and load, wherein the at least one detected deviation is indicative of at least one of a verification of an alert and a failing component.

16. The method according to claim 12, further including:

identifying a part along the optic fiber component; and generating an alert for the identified part.

17. The method according to claim 16, wherein each part includes a corresponding threshold temperature.

18. A non-transitory computer-readable storage medium storing instructions, which when executed by a processor, the instructions cause the processor to control one or more electronic data processing devices to perform the method of claim 12.

19. A cable for distributed temperature sensing in a magnetic resonance (MR) system, the cable comprising:

an electrically conductive cable component extending through the cable;

at least one cable trap coupled with the electrically conductive cable component; and a optic fiber component extending through the cable and the at least one cable trap in thermal contact with the electrically conductive cable component, and the at least one cable trap, the optical fiber component being configured to:

collect temperature and/or strain information at each of a plurality of positions along the optic fiber component;

provide performance indicators for an MR protocol based on the temperature and/or strain information;

provide remote performance diagnosis of the magnetic resonance system; and selectively identify abnormal operation of the magnetic resonance system based on the performance indicators and the remote performance diagnosis and based on comparing the collected temperatures at each of the plurality of positions and a different threshold temperature corresponding to each of the plurality of positions.

* * * * *